US006767828B2

United States Patent
Andry et al.

(10) Patent No.: US 6,767,828 B2
(45) Date of Patent: Jul. 27, 2004

(54) METHOD FOR FORMING PATTERNS FOR SEMICONDUCTOR DEVICES

(75) Inventors: Paul S. Andry, Mohegan Lake, NY (US); John C. Flake, Austin, TX (US); Bruno Michel, Adliswil (CH); Takatoshi Tsujimura, Fujisawa (JP)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/971,953

(22) Filed: Oct. 5, 2001

(65) Prior Publication Data

US 2003/0068480 A1 Apr. 10, 2003

(51) Int. Cl.⁷ .............................................. H01L 21/44
(52) U.S. Cl. ...................................... 438/677; 438/678
(58) Field of Search ................................ 438/677, 678, 438/903, FOR 347, FOR 390, 627, 628, 641, 643, 644, 800, 942; 427/98, 301, 304, 305, 306, 347

(56) References Cited

U.S. PATENT DOCUMENTS 5,079,600 A * 1/1992 Schnur et al. ............... 257/750
5,851,856 A * 12/1998 Nagura ........................ 438/130
6,348,240 B1 * 2/2002 Calvert et al. ............... 427/539

* cited by examiner

Primary Examiner—George Fourson
Assistant Examiner—Julio J. Maldonado
(74) Attorney, Agent, or Firm—Robert M. Trepp; F. Chau & Associates, LLC

(57) ABSTRACT

A method for forming an electrically conductive layer having predetermined patterns for semiconductor devices includes providing a substrate, forming an insulation layer having OH functional groups on the substrate, forming a patterned polymer layer on the insulation layer, etching the insulation layer to create a patterned insulation layer which has the same patterns as the patterned polymer layer, stripping the patterned polymer layer to expose the patterned insulation layer, treating the patterned insulation layer with a coupling agent which reacts with the OH functional groups, treating the patterned insulation layer with a catalyst-containing solution in which the catalyst reacts with the coupling agent, and depositing electrically conductive material on the patterned insulation layer which is catalytically active.

17 Claims, 6 Drawing Sheets

METHOD FOR FORMING PATTERNS FOR SEMICONDUCTOR DEVICES

BACKGROUND OF THE INVENTION

1. Field of the Invention

The present invention relates to a method for forming patterns for semiconductor devices, and in particular, relates to a method for forming an electrically conductive layer having desired patterns for semiconductor devices

2. Description of the Related Art

Micro-lithography is widely used in various technological fields such as semiconductor devices, display devices, printing devices, etc. Micro-lithography plays an important role especially in the semiconductor manufacturing technology. For instance, photolithography has been used for forming desired patterns in various types of layers for semiconductor devices.

FIG. 1 shows a conventional process for forming desired patterns for semiconductor devices using photolithography. In the conventional process, a layer 101, such as silicon, silicon nitride, etc., is deposited on a substrate 103 as shown in FIG. 1(a). The substrate 103 is made from, for example, glass, metal, and other suitable materials. A photoresist layer 105 is then formed on the deposited layer 101 as shown in FIG. 1(b). The photoresist layer 105 is typically a positive-type resist or a negative-type resist, and it is typically made from novolak resin combined with diazo ketone compounds, acrylic resin combined with photoinitiators, and polyvinyl phenol combined with onium salts.

The photoresist layer 105 is exposed to a light (e.g., ultraviolet light) in a exposing process as shown in FIG. 1(c). The photoresist layer 105 to be exposed to the light may have a mask with desired patterns. Upon consummation of the exposing process, the photoresist layer 105 is developed by a developer 107 to form patterns 109 on the deposited layer 101 as shown in FIG. 1(d). The developed patterns 109 may be exposed to a post-baking process in FIG. 1(e). Such photolithography technique is well known in this art, thus a detailed description thereof is omitted.

The process further proceeds to an etching process. In the etching process shown in FIG. 1(f), the deposited layer 101 is etched by suitable enchant 111. The etching process may be carried out in gaseous or liquid atmosphere depending on the enchant 111. After etching the deposited layer 101, the patterns 109 (i.e., remaining photoresist) are stripped off using a suitable stripper 113 as shown in FIG. 1(g). Then, as shown in FIG. 1(h), a layer is exposed that is patterned in accordance with the desired patterns in the photoresist layer.

In such conventional process of forming desired patterns on a substrate, many steps are required such as depositing an insulation layer, coating a photoresist layer, exposing the sample to the light, developing the sample with a developing agent, etching the insulation layer, stripping the remaining photoresist layer, etc. Thus, many apparatuses and/or instruments are required to perform the process, and large capital investment is necessary to construct production lines. Furthermore, since the conventional process is typically carried out as a wet process, a great amount of direct and indirect waste material may be produced. As a result, the conventional process requires a high cost in manufacturing semiconductor devices.

Therefore, there is a continuing need for providing a method of forming desired patterns for semiconductor devices which has less processes so as to reduce the product cost and waste material and increase productivity of the semiconductor devices.

OBJECTS AND SUMMARY OF THE INVENTION

It is an object of the present invention to provide a method for forming desired patterns for semiconductor devices through a process having reduced steps.

It is another object of the present invention to provide a semiconductor device having a patterned plating layer which is formed through a process having reduced steps.

It is still another object of the present invention to provide a semiconductor metallurgy for forming electrically conductive patterns in a semiconductor device using micro-contact printing and electroless plating processes.

To achieve the above and other objects, the present invention provides a method for forming an electrically conductive layer having predetermined patterns for semiconductor devices. The method includes the steps of providing a substrate, forming on the substrate an insulation layer which has predetermined functional groups, forming a patterned polymer layer having the patterns on the insulation layer, etching the insulation layer in accordance with the patterns of the patterned polymer layer to create a patterned insulation layer, stripping the patterned polymer layer to expose the patterned insulation layer, treating the patterned insulation layer with a coupling agent reacting with the predetermined functional groups, treating the patterned insulation layer with a catalyst-containing solution, and depositing electrically conductive material on the patterned insulation layer.

The insulation layer preferably includes silicon oxides ($SiO_x$), and the patterned polymer layer preferably includes solvent soluble polyimide. Preferably, the coupling agent is a silane coupling agent, and the predetermined functional groups are OH functional groups.

By the performing the method of the present invention, a semiconductor device may be provided having a substrate, a patterned insulation layer having predetermined patterns formed on the substrate, and a plating layer formed on the patterned insulation layer, the plating layer having electrically conductive patterns corresponding to the predetermined patterns of the patterned insulation layer, wherein the patterned insulation layer has catalytically active surfaces, and the electrically conductive patterns are formed by depositing electrically conductive material on the catalytically active surfaces of the patterned insulation layer.

In another aspect of the present invention, there is provided a method for forming an electrically conductive layer having patterns for semiconductor devices, including the steps of providing a substrate, forming on the substrate an insulation layer which has predetermined functional groups, forming a patterned polymer layer having the patterns on the insulation layer in which the patterned polymer layer has a coupling agent, etching the insulation layer in accordance with the patterns of the patterned polymer layer to create a patterned insulation layer, stripping the patterned polymer layer to expose the patterned insulation layer, treating the patterned insulation layer with a catalyst-containing solution, and depositing electrically conductive material on the patterned insulation layer.

These and other objects, features and advantages of the present invention will become apparent from the following detailed description of illustrative embodiments thereof, which is to be read in connection with the accompanying drawings.

BRIEF DESCRIPTION OF THE DRAWINGS

This disclosure will present in detail the following description of preferred embodiment with reference to the following figures wherein.

DESCRIPTION OF PREFERRED EMBODIMENTS

Detailed illustrative embodiments of the present invention are disclosed herein. However, specific structural and functional details disclosed herein are merely representative for purposes of describing preferred embodiments of the present invention and are not intended to limit the present invention.

Figure 1A:
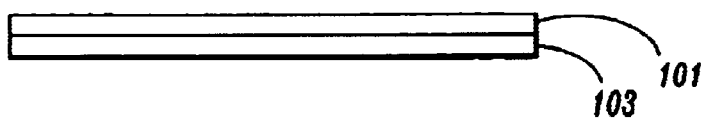
FIG. 1 shows a typical method of forming a patterned layer on a substrate.
Figure 1B:
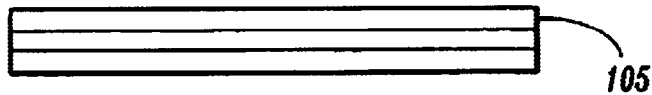
Figure 1C:
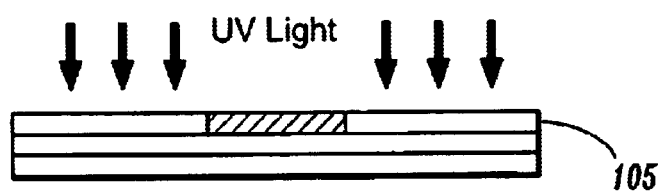
Figure 1D:
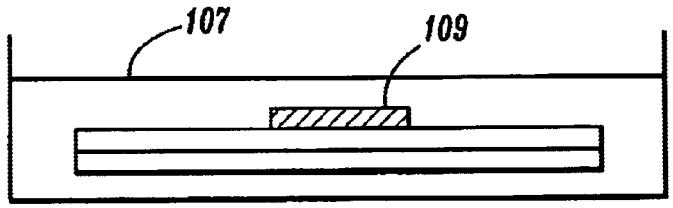
Figure 1E:
Figure 1F:
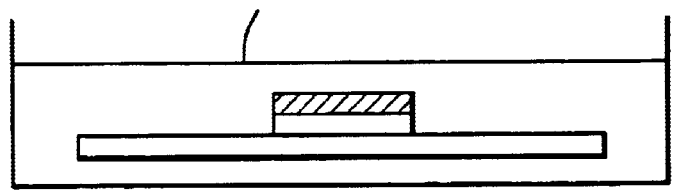
Figure 1G:
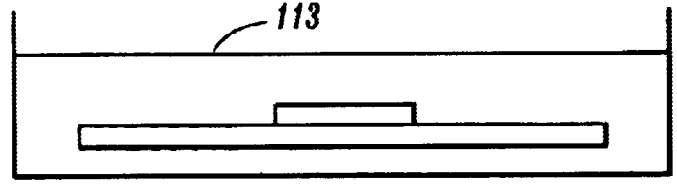
Figure 1H:
Figure 2:
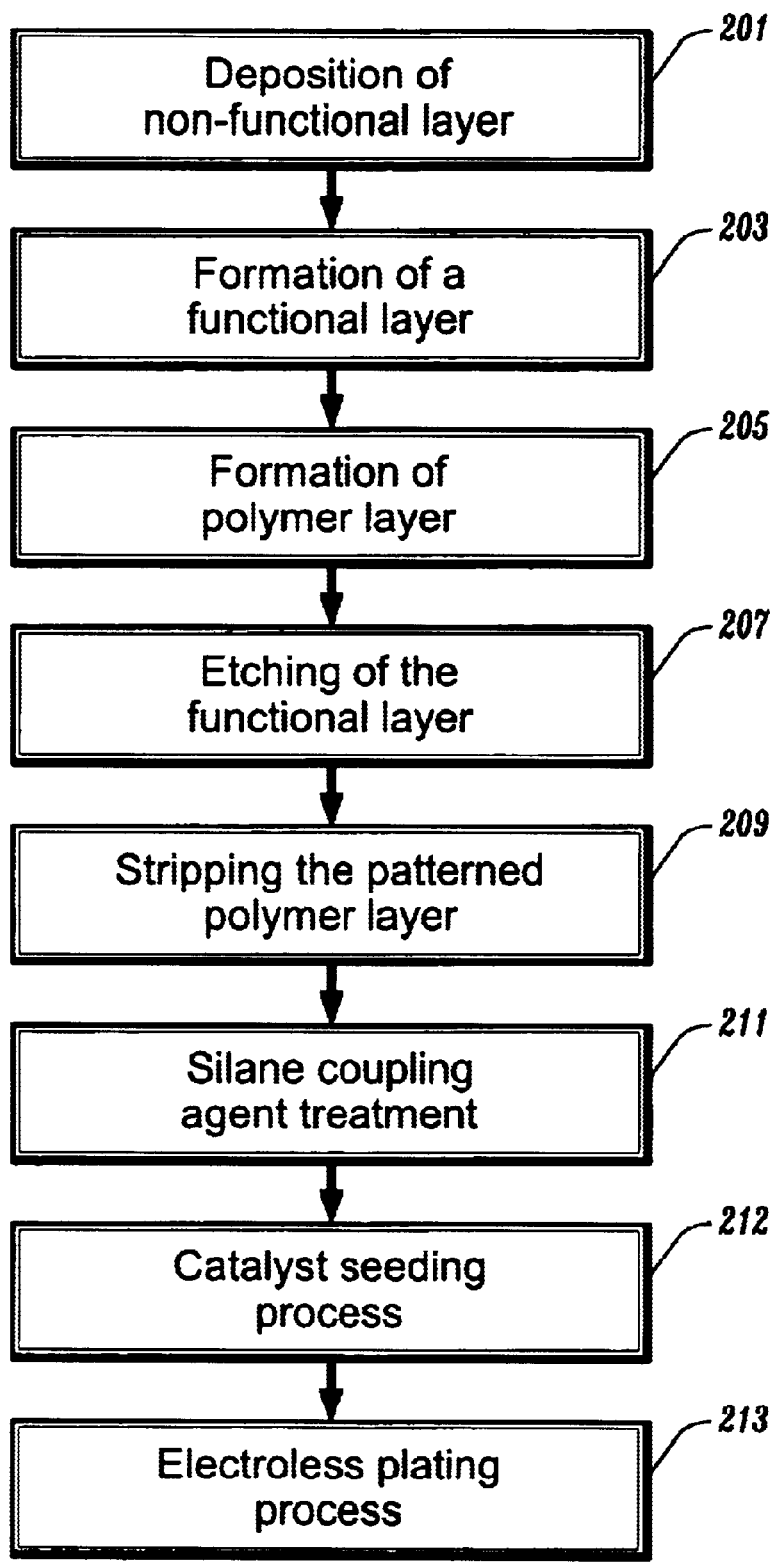
FIG. 2 is a flowchart for describing a method of forming a patterned plating layer on a substrate according to a preferred embodiment of the present invention.

Referring to FIG. 2, there is provided a flowchart illustrating a method of forming a patterned plating layer on a substrate according to a preferred embodiment of the present invention. First, a substrate is provided for fabricating semiconductor devices. The substrate may be glass, silicon (Si), or any appropriate material.

A nonfunctional layer is deposited on the substrate using sputtering or physical or chemical vapor deposition process (step 201). Then, a functional layer is deposited on the nonfunctional layer using a dry process such as chemical vapor deposition or a wet process such as a sol-gel process (step 203). The functional layer is preferably a thin insulation layer made of silicon oxides ($SiO_x$).

On the functional layer formed in step 203, a polymer layer is deposited using, for example, a photolithography or a micro-contact printing process (step 205). The polymer layer is patterned to have patterns desired for certain type(s) of semiconductor devices. The polymer layer preferably has a thickness between about 50 nm and 100 nm. The use of micro-contact printing technique brings advantages in that no wet process is required in forming the patterns of the polymer layer, so that process speed and productivity may be enhanced. In addition, by using the micro-contact printing technique in step 205, there is no need of using a developer to develop the polymer layer on the insulation layer. Thus, chemical waste may be reduced, and the manufacturing cost of the semiconductor devices may also be reduced.

Upon forming the patterned polymer layer, the functional layer is etched to form a patterned functional layer (step 207). As the functional layer is etched, the nonfunctional layer is exposed in the regions not covered with the patterned polymer layer. As a result, the patterned functional layer is surrounded by the surfaces of the exposed nonfunctional layer. Then, the patterned polymer layer on the patterned functional layer is stripped off using a suitable stripper such as solvent for the polymer (step 209).

After stripping off the patterned functional layer in step 209, a coupling agent treatment is applied to the surfaces of the insulation layers to modify the exposed surfaces of the patterned functional layer (step 211). Preferably, silane coupling agent is used as the coupling agent in the treatment. If the polymer layer contains the coupling agent, the coupling agent treatment (step 211) may be omitted.

Following the coupling agent treatment, catalyst seeding process is performed with respect to the surfaces of the insulation layers in which the surfaces of the patterned functional layer has been modified by the coupling agent treatment (step 212). Palladium (Pd) seed is preferably used in the catalyst seeding process and bonds to the coupling agent on the surfaces of the patterned functional layer. Thus, the surfaces of the patterned functional layer become catalytically active.

Finally, an eletroless plating (or deposition) process is performed on the surfaces of the insulation layers (step 213). In the electroless plating process, a plating layer is deposited on the catalytically active surfaces of the patterned functional layer. The plating layer is made from electrically conductive material. By performing the above steps 201–213, a plating layer having desired patterns for semiconductor devices may be obtained.

Compared with the conventional method in FIG. 1, the method for forming desired patterns according to the present invention significantly simplify the process, especially excluding wet processes, thereby improving productivity and reducing production cost of the semiconductor devices. A detailed description regarding each step of the flowchart in FIG. 2 follows.

Figure 3:
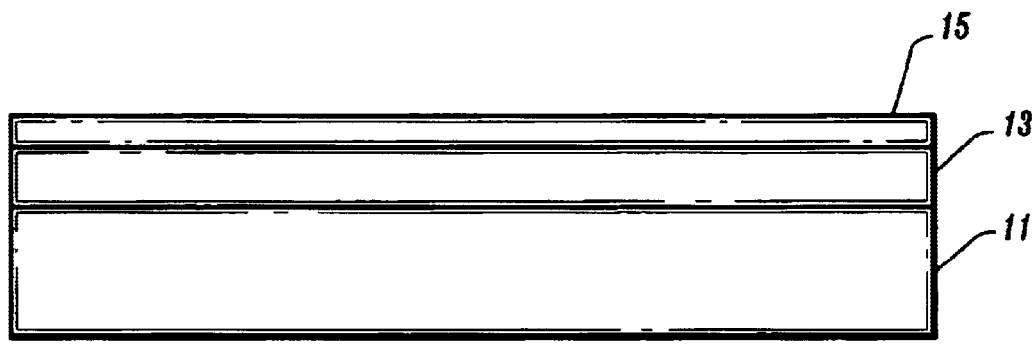
FIG. 3 is a cross-sectional view illustrating formation of insulation layers on a substrate according to the present invention.

Referring to FIG. 3, there is provided a cross-sectional view illustrating formation of insulation layers on which predetermined patterns will be formed according to the present invention. A substrate 11 is first provided on which functional and nonfunctional layers are deposited. The substrate 11 may be silicon, metal, or any other organic material. Preferably, the substrate 11 is made of glass, and the glass may include, but not limited to, alkali glass or non-alkali glass such as soda-lime glass, soda-lime glass coated with silica barrier layer, borosilicate glass, almino-borosilicate glass, quartz selected from silica glass, fused silica, and vitreous silica.

A nonfunctional layer 13 is formed on the substrate 11, and a functional layer 15 is formed on the nonfunctional layer 13. The nonfunctional and functional layers 13, 15 are preferably insulation layers. The nonfunctional layer 13 is preferably formed of silicon nitride ($SiN_x$). But, any material, for example, silicon or metal (e.g., aluminum) may be deposited on the substrate 11 to form the nonfunctional layer 13 depending on a particular application of semiconductor devices to be fabricated. The nonfunctional layer 13 preferably has a thickness of about 50 nm. However, the thickness of the nonfunctional layer 13 may vary depending on a specific purpose of the semiconductor devices or the substrate, and it typically ranges from several nano-meters (nm) to several hundred nano-meters (nm).

The functional layer 15 is preferably made of silicon oxides ($SiO_x$). The functional layer 15 may have a thickness ranged from about 1 nm to about 100 nm, preferably from about 1 nm to about 10 nm. However, the thickness of the functional layer 15 may be as thin as possible to form fine patterns. The functional layer 15 is preferably made of material providing hydroxide (OH) functionality on its surface, for example, PECVD-deposited $SiO_x$. By using the material providing OH functionality, the functional layer 15 can be easily etched without degrading the nonfunctional layer 13. However, the material for forming the functional layer 15 may be selected from any material as long as providing sufficient OH functionality on its surface and etching the functional layer 15 without damaging the underlying layers.

The nonfunctional and functional layers 13, 15 may be formed by any film-forming process, for example, a sputtering method, physical vapor deposition process, chemical vapor deposition process, a sol-gel process, or coating method using a suitable solution of a substance for forming the layers.

Figure 4:
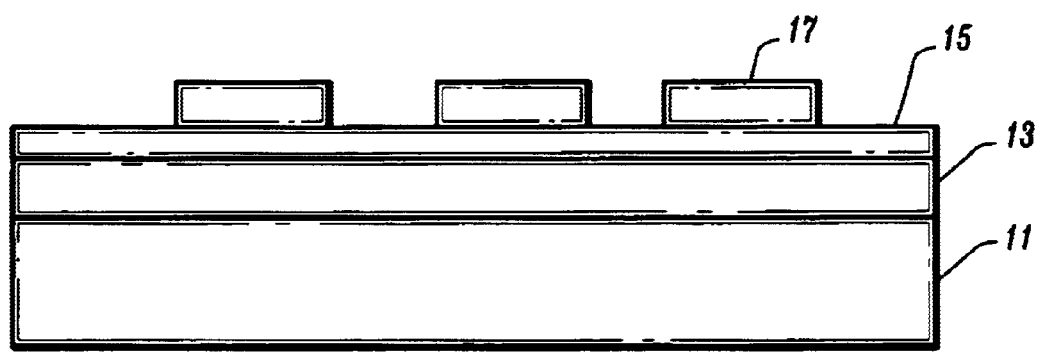
FIG. 4 is a cross-sectional view illustrating formation of a patterned polymer layer on the insulation layer according to the present invention.

Referring to FIG. 4, a polymer layer 17 is formed on the functional insulation layer 15. It should be avoided that the polymer layer 17 has such thickness as to affect producibility of a sufficient shape in a subsequent etching process to be performed with respect to the functional layer 15. The polymer layer 17 may have patterns desired for semiconductor devices to be fabricated. The thickness of the polymer layer 17 may be in the range from about several nm to several hundreds nm, preferably, from about 50 nm to about 100 nm. It should be noted that the production of desired patterns may be affected by the thickness of the polymer layer 17. If the polymer layer 17 is too thick, the etching of the functional layer 15 may be so much affected as to bring failure or difficulties in producing the desired patterns.

Material for the polymer layer 17 may be one of phenol novolak resin, acrylic resin, polyvinylphenol, polyimide resin, solvent soluble polyimide such as polyamic acid polymer, polyamide, poly-sulfone, poly-ether sulfone, polycarbonate, and any possible mixtures thereof. The polymer layer 17 is preferably formed from solvent soluble polyimide to form excellent patterns on the functional insulation layer 15. Such solvent soluble polyimide may include, for example, polyamic acid prepared from pyromellitic acid dianhydride and diamino diphenyl ether. Another example for solvent soluble polyimide is polyimide prepared from 2,3,5-tricarboxy-cycropentyl acetic acid dianhydride and diaminodiphenyl methane. A solvent to dissolve the polyimide may include high dielectric solvents such as, for example, N-butyrolactone, N-methyl pyrrolidone, N,N-dimethyl formamide, and any mixture thereof. Any types of polyimide and solvent may be used in the present invention as far as the polymer layer 17 with proper thickness is formed.

The patterned polymer layer 17 is formed on the functional insulation layer 15 using, for example, a micro-contact printing technique. The size of patterns of the polymer layer 17 may be in the range between about 0.1 mm and about 1 mm depending on a specific application of semiconductor devices to be fabricated. For example, the size of the patterns may be in the range from about 2 mm to about 5 mm when the semiconductor devices are used for display devices such as a liquid crystal display device or an organic electro-luminescence display device. The patterned polymer layer 17 on the insulation layer 15 is then heated at about 180° C. and dried to remove the solvent.

The micro-contact printing technique allows it to print the thin polymer layer 17 on the insulation layer 15 without spreading the polymer on the insulation layer 15. The micro-contact printing technique suitable for providing the patterned polymer layer 17 may be carried out, for example, using a base mask having negative patterns corresponding to the patterns to be printed on the insulation layer 15. The negative patterns of the base mask may be formed using, for example, an electron beam, a laser beam, micro-lithography, or other suitable techniques. Such formation of the base mask is well known to those skilled in the art. The polymer layer having the base mask thereon is dissolved in a suitable solvent so that the polymer to be printed on the functional layer 15 in accordance with the patterns of the base mask remains on the functional layer 15. Upon dissolving the polymer layer according to the patterns of the base mask, the base mask is peeled off from the polymer layer to form (or print) the patterned polymer layer 17 on the functional layer 15.

Figure 5:
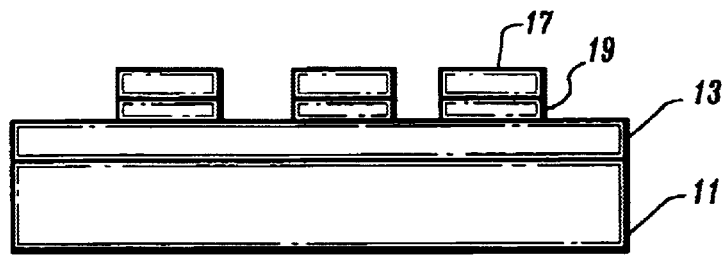
FIG. 5 is a cross-sectional view illustrating formation of a patterned insulation layer by an etching process according to the present invention.

Referring to FIG. 5, there is a cross-sectional view illustrating formation of a patterned functional layer according to the present invention. After forming the patterned polymer layer, the functional layer 15 (referring to FIG. 4) is etched in accordance with the patterns of the patterned polymer layer to form a patterned functional layer 19. The etched portions of the functional layer 15 are removed from the underlying nonfunctional layer 13. As a result, the patterned functional layer 19 is surrounded by the surfaces of the nonfunctional layer 13. The patterned functional layer 19 may have sharper patterns by way of a sufficient overetch.

In the etching process of the functional layer, the patterned polymer layer 17 is used as an etching resist for the functional layer. In other words, after the etching process, the portions of the functional layer directly under the patterned polymer layer 17 remains on the nonfunctional layer 13, while the non-covered portions of the functional layer are removed. The patterned functional layer 19 will be used to form electrically conductive patterns (e.g., wires) for semiconductor devices. This is described in detail below.

In case that the functional layer is made of $SiO_x$, an etchant for the etching process is preferably a buffered HF solution which is effective to dissolve silicon oxides. The buffered HF solution may be prepared by dissolving ammonium hydrogen fluoride in water at a proper concentration. In case that the functional layer is made of material other than $SiO_x$, other appropriate material may be used as an etchant.

Figure 6:
FIG. 6 is a cross-sectional view illustrating a treatment of the stacked layers with silane coupling agent according to the present invention.
Figure 6:
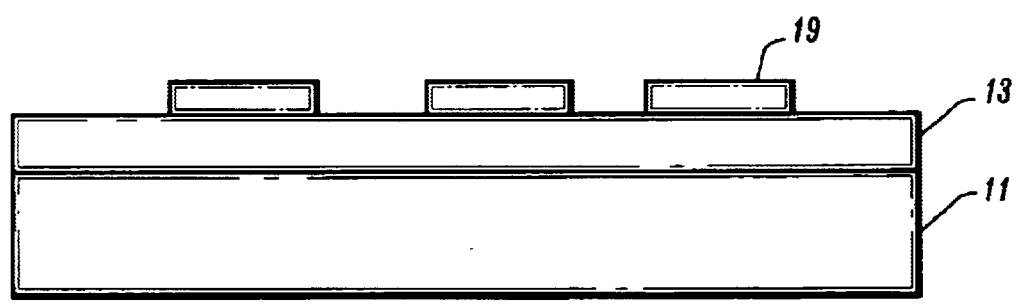

Referring to FIG. 6, the patterned polymer layer 17 used as an etching resist is removed using a suitable solvent so that surfaces of the patterned functional layer 19 are exposed. Then, the exposed surfaces of the patterned functional layer 19 and the nonfunctional layer 13 are treated with silane coupling agent. During the silane coupling agent treatment, the silane coupling agent has a chemical reaction with the surfaces of the patterned functional layer 19, while having substantially no reaction with the surfaces of the nonfunctional layer 13. As a result of the silane coupling agent treatment, there is formed on the surfaces of the patterned functional layer 19 a grafting layer which has an affinity for catalyst.

Figure 7:
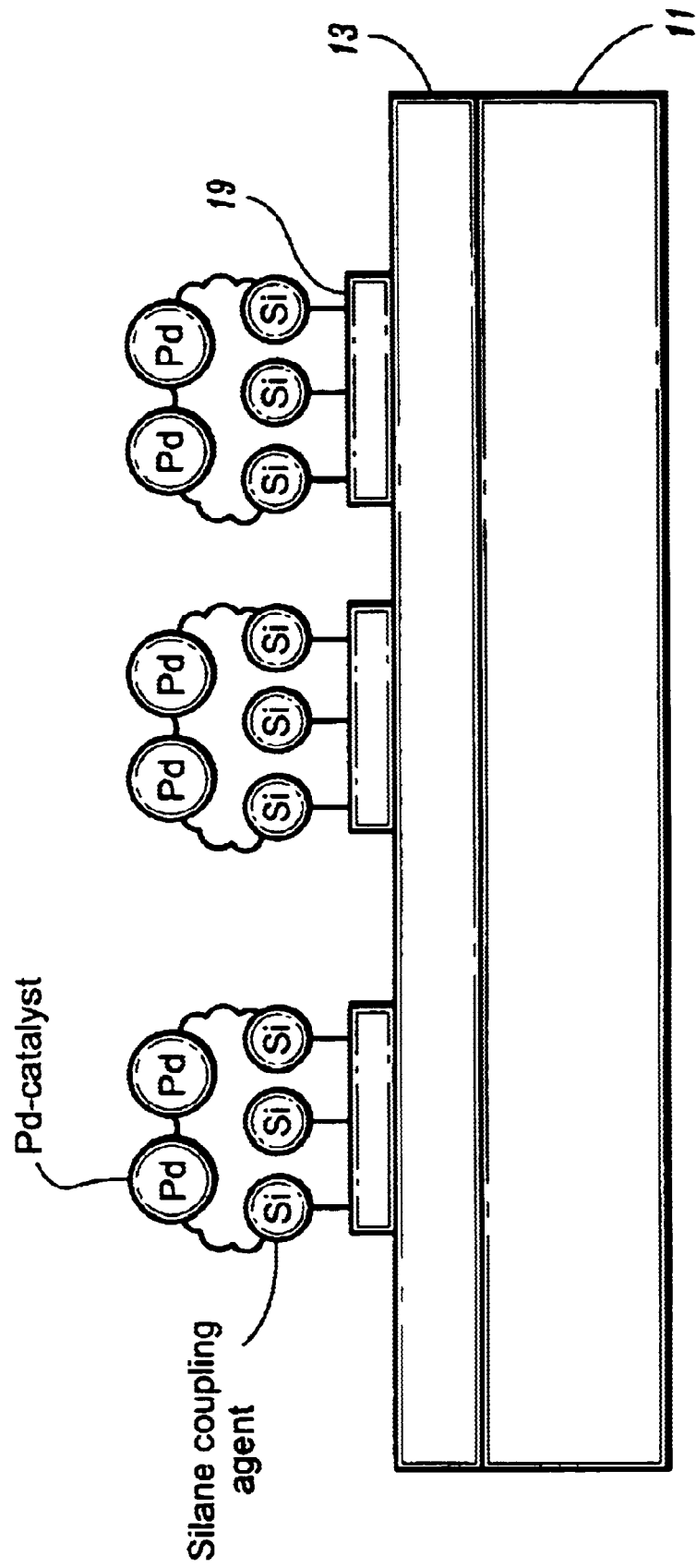
FIG. 7 is a partially enlarged diagram illustrating chemical reactions on the surfaces of the patterned insulation layer according to the present invention.

FIG. 7 is a partially enlarged diagram depicting reaction of the silane coupling agent with catalyst, for example, Pd-catalyst. When a catalyst-containing solution is applied to the surfaces of the sample, the silane coupling agent bonding to the surfaces of the patterned functional layer 19 (e.g., $SiO_x$ layer) acts as an uptake layer for the catalyst. As a result, the catalyst (e.g., Pd) is seeded on the surfaces of the patterned functional layer 19. Electrically conductive material will be plated on the catalyst-seeded surfaces of the patterned functional layer 19.

The silane coupling agent applied to the surfaces of the patterned functional layer 19 preferably has a formula of "$R_m$—Si—$(OR')_{4-m}$" herein, "R" may be selected from the group including $C_{1-10}$ alkyl, $C_{1-10}$ aryl groups, and derivatives thereof including nitrogen, sulfur and phosphorous, "R'" may be selected from the group including $C_{1-10}$ alkyl groups, and "m" is a positive integer.

The silane coupling agent reacts with OH functional groups in the surfaces of the patterned functional layer 19 so that the surfaces of the patterned functional layer 19 have a grafting layer for taking, for example, Pd seeds from Pd-containing solution. The Pd seeds grafted with the silane coupling agent on the surfaces of the patterned functional layer 19 are used for

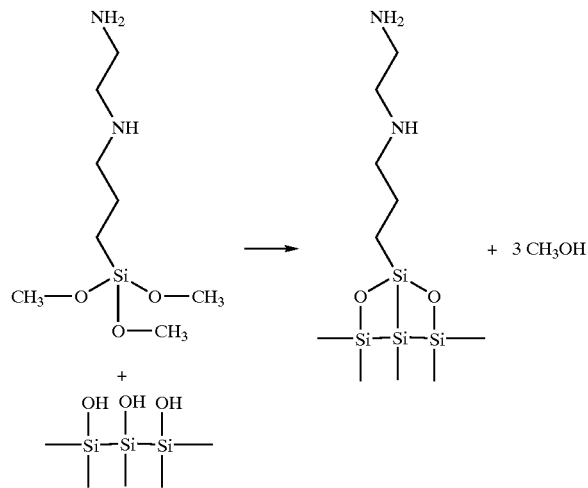

electroless plating of electrically conductive material. The silane coupling agent used in the present invention preferably includes N-(2-aminoethyl)-3-amino-propyltrimethoxysilane as described below:

The reaction between the silane coupling agent and the OH functional groups is thermodynamically favored at room temperatures and may be carried out in various conditions including aqueous solution, non-aqueous solution, or gaseous atmosphere. In the present invention, the silane coupling agent treatment is preferably carried out in the atmosphere where vapor of the silane coupling agent is introduced into a chamber. The substrate 11 may be heated to speed up the treatment. When a solution containing the silane coupling agent is used for the treatment, the solution may include, for example, 95 volume % ethanol, 4.5 volume % water and 0.5 volume % silane coupling agent. The silane coupling agent strongly chemisorbs the catalyst for the electroless plating process during which electrically conductive material is selectively deposited on the patterned functional layer 19. It should be noted that, although Pd-catalyst is used in this embodiment, the catalyst for the electroless plating process may be selected from, for example, Pd, Pt, Sn, Ni or any mixture thereof.

Referring to FIG. 4 again, as another embodiment of the present invention, the silane coupling agent may be included in the patterned polymer layer 17. In this case, the silane coupling agent in the polymer layer 17 reacts with OH functional groups in the functional layer 15 during a heat treatment of the polymer layer 17. Thus, the patterning of the functional layer 15 and the grafting of the silane coupling agent on the patterned functional layer may be carried out in one step.

Other possible silane coupling agents may include, for example, N-aminoethyl-N-aminopropylmethyldimethoxy silane, N-aminopropyltriethoxy silane, N-phenyl-N-aminopropyltrimethoxy silane, N-mercaptopropyltrimethoxy silane, N-chloropropyltrimethoxy silane, N-(2-aminoethyl)-amino-propyltrimethoxy silane and any mixture thereof (here, "N" denotes any natural number). The present invention may use any other silane coupling agents such as sulfur or phosphorous including silane coupling agents and nitrogen containing silane coupling agents.

As shown in FIG. 7, the silane coupling agent bonds to the surfaces of the patterned functional layer 19 and the catalyst (e.g., Pd). A Pd/Sn colloidal solution may be used to provide the Pd-catalyst. The silane coupling agent takes up catalytically active Pd from the solution. In contrast, the surfaces of the nonfunctional layer 13 surrounding the patterned functional layer 19 remain free from Pd. Since the surfaces of the nonfunctional layer 13 do not react with the silane coupling agent, only the surfaces of the patterned functional layer 19 are catalytically active and will be plated with electrically conductive material (e.g., metal).

Figure 8:
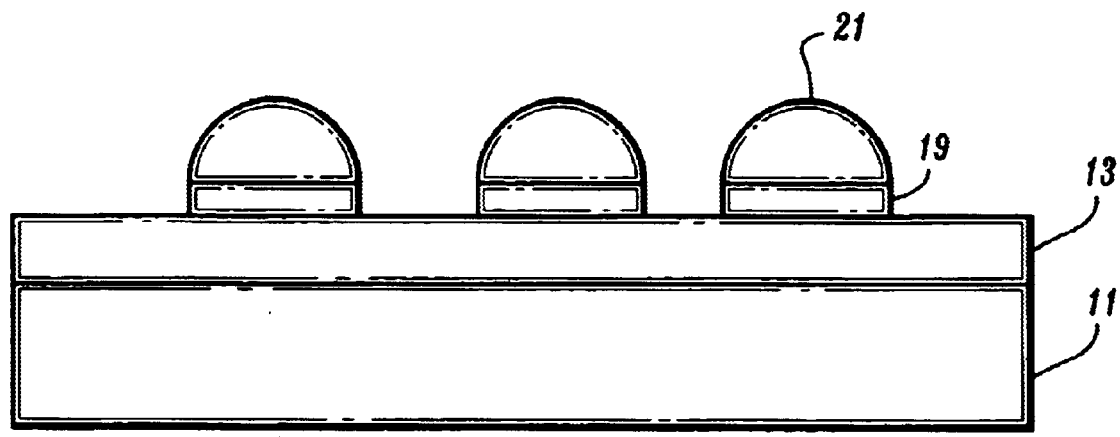
FIG. 8 is a cross-sectional view illustrating an electroless plating process according to the present invention.

Referring to FIG. 8, there is a cross-sectional view illustrating formation of a plating layer 21 on the surfaces of the patterned functional layer 19 using an electroless plating method. The plating layer 21 is formed by depositing electrically conductive material on the catalytically active surfaces of the patterned functional layer 19. The plating layer 21 is preferably an electroless metal layer 21 made of metal such as copper (Cu), silver (Ag), palladium (Pd), nickel (Ni), cobalt (Co), gold (Au), platinum (Pt), and any alloys thereof. The electroless plating method adopted for formation of the plating layer 21 is well known in this art, thus a detailed description thereof is omitted.

Figure 9:
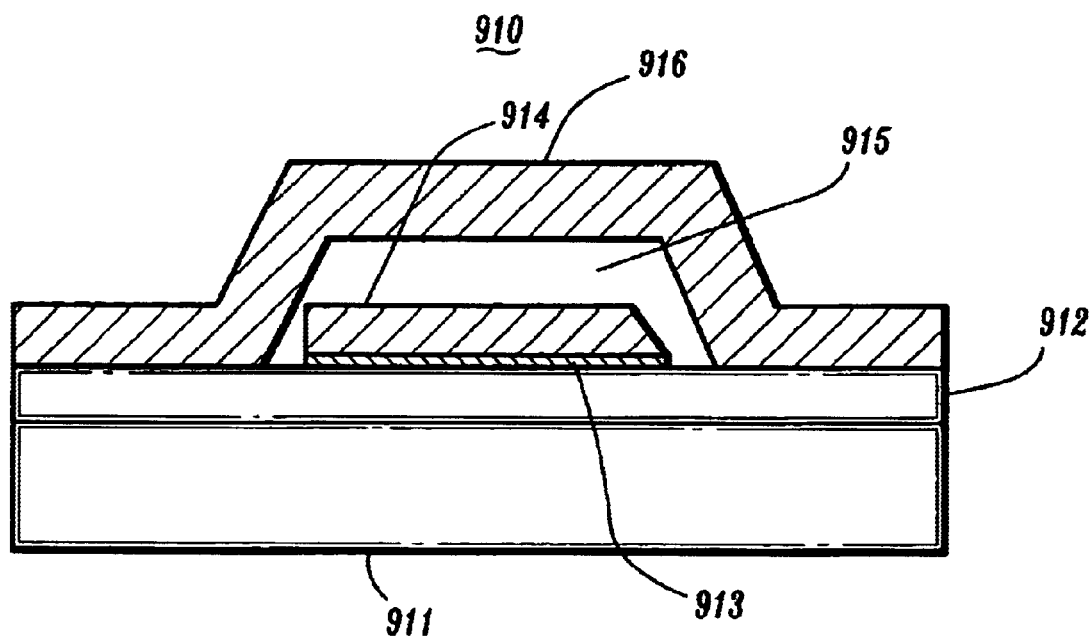
FIG. 9 is a cross-sectional view illustrating a semiconductor device formed using the method for forming desired patterns according to the present invention.

Referring to FIG. 9, there is provided a cross-sectional view illustrating a semiconductor device constructed according to the method of the present invention. The semiconductor device 910 may be a part of a thin film transistor (TFT) for the use of liquid crystal display devices. The semiconductor device 910 includes a substrate 911, an insulation layer 912 formed from $SiN_x$, and a functional insulation layer 913 formed from $SiO_x$.

A signal wiring electrode 914 is formed, as described above, on the functional insulation layer 913 by plating electroless metal or electrically conductive material. An oxidized anode layer 915 is formed on the signal wiring electrode 914 using a suitable anodic oxidization method. A pixel wiring electrode 916 covers the oxidized anode layer 915 to construct a switching device, called MIM (metal insulator metal) device. In the construction of the semiconductor device 910, the patterned functional layer 913 formed on the nonfunctional insulation layer 912 is used to form the patterns of the electrically conductive layer, i.e., the signal wiring electrode 914.

Advantageously, the method according to the present invention may be used in fabricating the metallurgy for a liquid crystal display, an organic electro-luminescence display, or an integrated circuit.

As described above, the present invention has been explained using specific embodiments shown in the drawings, however the present invention implicitly suggests the possibility of other semiconductor devices and the metallurgy used in those semiconductor devices such as wiring, electrodes, etc. It may be appreciated for a person skilled in the art that various modifications, omissions, or other embodiments may be possible without departing from the scope and spirit of the present invention. The true scope of the present invention may be understood by the appended claims.

What is claimed is:

1. A method for forming an electrically conductive layer having patterns for semiconductor devices, comprising the steps of:
    providing a substrate;
    forming a first insulation layer on the substrate;
    forming a second insulation layer on the first insulation layer, the second insulation layer having predetermined functional groups;
    forming a patterned polymer layer having the patterns on the second insulation layer;
    etching the second insulation layer in accordance with the patterns of the patterned polymer layer to create a patterned insulation layer;
    stripping the patterned polymer layer to expose the patterned insulation layer;
    treating the patterned insulation layer and resulting exposed first insulation layer with a coupling agent reacting with the predetermined functional groups;
    treating the patterned insulation layer with a catalyst-containing solution; and
    selectively depositing the electrically conductive layer having patterns on the patterned insulation layer.

2. The method of claim 1, wherein the predetermined functional groups include OH functional groups.

3. The method of claim 2, wherein the second insulation layer is a silicon oxide ($SiO_x$) layer.

4. The method of claim 1, wherein the catalyst-containing solution includes a catalyst selected from the group consisting palladium (Pd), platinum (Pt), tin (Sn), nickel (Ni), and any alloy thereof.

5. The method of claim 1, wherein the second insulation layer has a thickness between about 1 nm and about 10 nm.

6. The method of claim 1, wherein the patterned polymer layer is formed by photolithography or micro-contact printing.

7. The method of claim 1, wherein the patterned polymer layer has a thickness between about 50 nm and about 100 nm.

8. The method of claim 1, wherein the patterned polymer layer comprises a solvent soluble polyimide.

9. The method of claim 1, wherein the catalyst-containing solution has a catalyst making a bonding reaction with the coupling agent.

10. The method of claim 9, wherein the catalyst-containing solution is selected from the group consisting of a Pd/Sn colloidal mixture, an aqueous solution of $PdCl_2$, and any mixture thereof.

11. The method of claim 9, wherein the step of treating the patterned insulation layer with the catalyst-containing solution includes making surfaces of the patterned insulation layer catalytically active, so that the electrically conductive material is deposited on the catalytically active surfaces of the patterned insulation layer.

12. The method of claim 1, wherein the coupling agent is a silane coupling agent, and the predetermined functional groups are OH functional groups.

13. The method of claim 1, wherein the electrically conductive material is selected from the group consisting of copper, silver, palladium, nickel, cobalt, gold, platinum, and any alloy thereof.

14. A method for forming an electrically conductive layer having patterns for semiconductor devices, comprising the steps of:
    providing a substrate;
    forming a first insulation layer on the substrate;
    forming a second insulation layer on the first insulation layer, the second insulation layer having predetermined functional groups;
    forming a patterned polymer layer having the patterns on the second insulation layer the patterned polymer having a coupling agent;
    etching the second insulation layer in accordance with the patterns of the patterned polymer layer to create a patterned insulation layer;
    stripping the patterned polymer layer to expose the patterned insulation layer;
    treating the patterned insulation layer and the resulting exposed first insulation layer with a catalyst-containing solution; and
    depositing electrically conductive material on the patterned insulation layer.

15. The method of claim 14, wherein the coupling agent in the patterned polymer layer reacts with the predetermined functional groups in the second insulation layer.

16. The method of claim 15, wherein the coupling agent is a silane coupling agent and the predetermined functional groups are OH functional groups.

17. A method for forming an electrically conductive layer having patterns for semiconductor devices, comprising the steps of:
    providing a substrate;
    forming a first insulation layer on the substrate;
    forming a second insulation layer on the first insulation layer, the second insulation layer having predetermined functional groups;
    forming a patterned polymer layer having the patterns on the second insulation layer, the patterned polymer comprises solvent soluble polyimide;
    etching the second insulation layer in accordance with the patterns of the patterned polymer layer to create a patterned insulation layer;
    stripping the patterned polymer layer to expose the patterned insulation layer;
    treating the patterned insulation layer and the resulting exposed first insulation layer with a catalyst-containing solution; and
    depositing electrically conductive material on the patterned insulation layer.

* * * * *